United States Patent
Naito et al.

(10) Patent No.: US 9,035,289 B2
(45) Date of Patent: May 19, 2015

(54) NONVOLATILE MEMORY DEVICE (71) Applicant: KABUSHIKI KAISHA TOSHIBA, Minato-ku, Tokyo (JP)

(72) Inventors: Katsuyuki Naito, Tokyo (JP); Shinya Aoki, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 13/930,832

(22) Filed: Jun. 28, 2013

(65) Prior Publication Data

US 2014/0027698 A1 Jan. 30, 2014

(30) Foreign Application Priority Data

Jul. 27, 2012 (JP) .................. 2012-167708

(51) Int. Cl.
*H01L 35/24* (2006.01)
*H01L 45/00* (2006.01)
*H01L 51/05* (2006.01)
*H01L 27/28* (2006.01)

(52) U.S. Cl.
CPC ............ *H01L 45/12* (2013.01); *H01L 51/0591* (2013.01); *H01L 27/285* (2013.01)

(58) Field of Classification Search
CPC ............ H01L 51/0541; H01L 51/0545; H01L 51/0036; H01L 51/5012
USPC ............................................. 257/40, E51.001
See application file for complete search history.

(56) References Cited

FOREIGN PATENT DOCUMENTS

JP 2007-67408 3/2007

OTHER PUBLICATIONS

Aoki, U.S. Appl. No. 13/949,435, filed Jul. 24, 2013.
Sakai, K. et al., "Electrical Memory Switching in Langmuir-Blodgett Films," Thin Solid Films, vol. 179, pp. 137-142, (1989).

*Primary Examiner* — Anthony Ho
(74) *Attorney, Agent, or Firm* — Finnegan, Henderson, Farabow, Garrett & Dunner, L.L.P.

(57) ABSTRACT

A nonvolatile memory device includes a first conductive unit, a second conductive unit, and a storage layer. The first conductive unit has a first work function. The second conductive unit has a second work function smaller than the first work function. The storage layer is provided between the first conductive unit and the second conductive unit. The storage layer is made using a source material including an aromatic diamine molecule and an aromatic tetracarboxylic dianhydride molecule. An ionization potential of the aromatic diamine molecule is greater than the first work function. An electron affinity of the aromatic tetracarboxylic dianhydride molecule is less than the second work function.

20 Claims, 7 Drawing Sheets

NONVOLATILE MEMORY DEVICE

CROSS-REFERENCE TO RELATED APPLICATIONS

This application is based upon and claims the benefit of priority from Japanese Patent Application No. 2012-167708, filed on Jul. 27, 2012; the entire contents of which are incorporated herein by reference.

FIELD

Embodiments described herein relate generally to a nonvolatile memory device.

BACKGROUND

The demand for nonvolatile memory devices that are small and have large bit densities is rapidly increasing. Next-generation nonvolatile memory devices are being developed to realize ultra high speed, high bit density, low power consumption, and low price characteristics that surpass the physical limits of existing silicon nonvolatile memory devices. For example, such a next-generation nonvolatile memory device has been proposed in which a resistance change material has a low resistance state and a high resistance state. It is desirable to improve the memory characteristics such as the voltage of the switching, the repetition tolerance, the retention time, etc., of such a resistance change nonvolatile memory device.

DETAILED DESCRIPTION

According to one embodiment, a nonvolatile memory device includes a first conductive unit, a second conductive unit, and a storage layer. The first conductive unit has a first work function. The second conductive unit has a second work function smaller than the first work function. The storage layer is provided between the first conductive unit and the second conductive unit. The storage layer is reversibly transitionable between a first state and a second state by at least one selected from a voltage applied via the first conductive unit and the second conductive unit and a current supplied via the first conductive unit and the second conductive unit. The second state has a higher resistance than the first state. The storage layer is made using a source material including an aromatic diamine molecule and an aromatic tetracarboxylic dianhydride molecule. An ionization potential of the aromatic diamine molecule is greater than the first work function. An absolute value of the difference between the ionization potential and the first work function is not less than 0.5 eV and not more than 2.0 eV. An electron affinity of the aromatic tetracarboxylic dianhydride molecule is less than the second work function. An absolute value of the difference between the electron affinity and the second work function is not less than 0.5 eV and not more than 2.0 eV.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1:
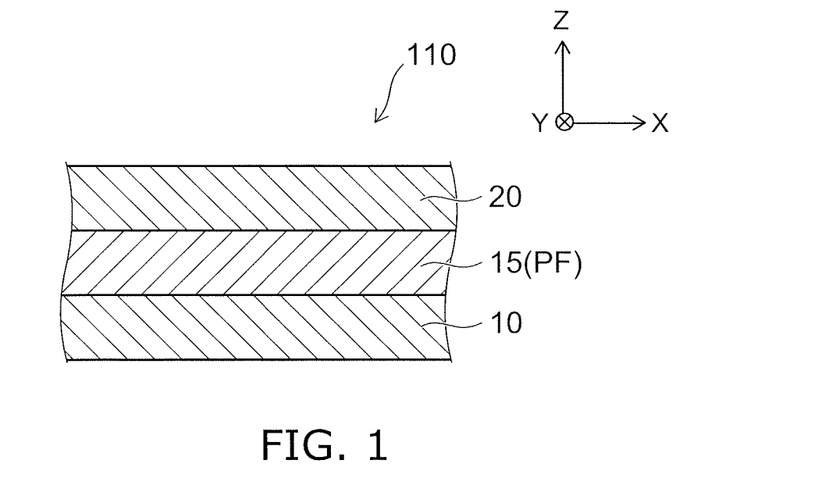
FIG. 1 is a schematic cross-sectional view showing a nonvolatile memory device according to a first embodiment.

FIG. 1 is a schematic cross-sectional view showing a nonvolatile memory device according to a first embodiment.

As shown in FIG. 1, the nonvolatile memory device 110 according to the embodiment includes a first conductive unit 10, a second conductive unit 20, and a storage layer 15. The storage layer 15 is provided between the first conductive unit 10 and the second conductive unit 20.

For example, a voltage may be applied to the storage layer 15 via the first conductive unit 10 and the second conductive unit 20. For example, a current may be supplied to the storage layer 15 via the first conductive unit 10 and the second conductive unit 20. The storage layer 15 is reversibly transitionable between a first state (a low resistance state) in which the resistance is low and a second state (a high resistance state) having a higher resistance than the first state by at least one selected from the voltage and the current.

The storage layer 15 is made using a source material including at least an aromatic diamine molecule and an aromatic tetracarboxylic dianhydride molecule. In the example, the storage layer 15 is a polyimide film PF. The thickness of the storage layer 15 is, for example, not less than 5 nm and not more than 80 nm.

The nonvolatile memory device 110 stores information by transitioning between the states of the storage layer 15. For example, the high resistance state is taken as the digital signal of "0;" and the low resistance state is taken as the digital signal of "1." Thereby, one bit of information of the digital signal can be stored.

Figure 2:
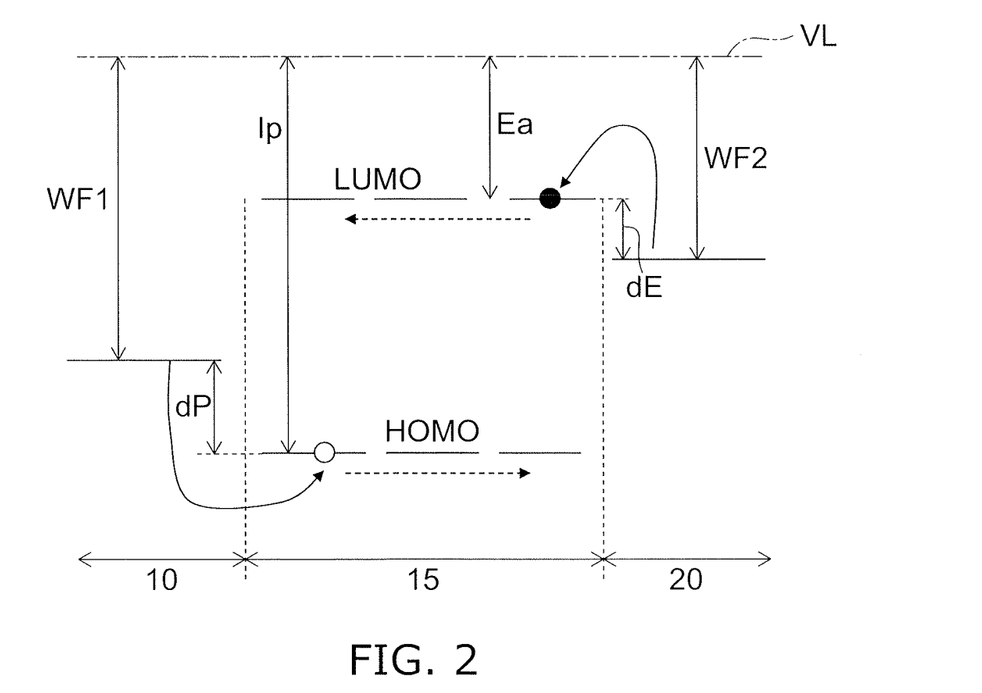
FIG. 2 is a band diagram showing characteristics of the nonvolatile memory device according to the first embodiment.

FIG. 2 is a band diagram showing characteristics of the nonvolatile memory device according to the first embodiment.

FIG. 2 shows the relationship between the energy levels having a vacuum level VL as a reference and the thickness-direction position from the first conductive unit 10 toward the second conductive unit 20. FIG. 2 shows the state in which a voltage is not applied between the first conductive unit 10 and the second conductive unit 20 (a state in which the potential difference between the first conductive unit 10 and the second conductive unit 20 is small).

As shown in FIG. 2, a first work function WF1 of the first conductive unit 10 is larger than a second work function WF2 of the second conductive unit 20. The first work function WF1 is, for example, not less than 3.5 eV and not more than 7.0 eV. The second work function WF2 is, for example, not less than 3.5 eV and not more than 7.0 eV.

In the state in which the voltage is not applied between the first conductive unit 10 and the second conductive unit 20, an ionization potential Ip of the storage layer 15 is greater than the first work function WF1. The ionization potential Ip is, for example, the HOMO (Highest Occupied Molecular Orbital) level of the storage layer 15. The absolute value of the difference dP between the ionization potential Ip and the first work function WF1 is, for example, not less than 0.5 eV and not more than 2.0 eV. An electron affinity Ea of the storage layer 15 is less than the second work function WF2. The electron affinity Ea is, for example, the LUMO (Lowest Unoccupied Molecular Orbital) level of the storage layer 15. The absolute value of the difference dE between the electron affinity Ea and the second work function WF2 is, for example, not less than 0.5 eV and not more than 2.0 eV. The ionization potential Ip is, for example, not less than 5.5 eV and not more than 9.0 eV. The electron affinity Ea is, for example, not less than 1.5 eV and not more than 5.0 eV. The absolute value of the difference between the absolute value of the difference dP and the absolute value of the difference dE is, for example, not more than 0.5 eV.

The ionization potential Ip of the storage layer 15 is affected by the ionization potential of the aromatic diamine molecule which is a source material. The absolute value of the difference between the ionization potential of the aromatic diamine molecule and the first work function WF1 is, for example, not less than 0.5 eV and not more than 2.0 eV.

Thereby, the difference dP recited above is set. In the case where the absolute value of the difference (the absolute value of the difference dP) between the ionization potential of the aromatic diamine molecule and the first work function WF1 is less than 0.5 eV, the injection of holes into the storage layer 15 is easy. However, the record retention time shortens because the discharge of the holes from the storage layer 15 also is easy. In the case where the absolute value of the difference (the absolute value of the difference dP) between the ionization potential of the aromatic diamine molecule and the first work function WF1 is greater than 2.0 eV, the drive voltage of the nonvolatile memory device 110 increases.

The electron affinity Ea of the storage layer 15 is affected by the electron affinity of the aromatic tetracarboxylic dianhydride molecule which is a source material. The absolute value of the difference between the electron affinity of the aromatic tetracarboxylic dianhydride molecule and the second work function WF2 is, for example, not less than 0.5 eV and not more than 2.0 eV. Thereby, the difference dE recited above is set. In the case where the absolute value of the difference between the electron affinity of the aromatic tetracarboxylic dianhydride molecule and the second work function WF2 is less than 0.5 eV, the injection of electrons into the storage layer 15 is easy. However, the record retention time shortens because the discharge of the electrons from the storage layer 15 also is easy. In the case where the absolute value of the difference between the electron affinity of the aromatic tetracarboxylic dianhydride molecule and the second work function WF2 is greater than 2.0 eV, the drive voltage of the nonvolatile memory device 110 increases.

The absolute value of the difference between the absolute value of the difference between the ionization potential of the aromatic diamine molecule and the first work function WF1 and the absolute value of the difference between the electron affinity of the aromatic tetracarboxylic dianhydride molecule and the second work function WF2 is, for example, not more than 0.5 eV.

The portion of the storage layer 15 made from the aromatic diamine molecule has a donor component. Therefore, it is considered that the holes injected into the storage layer 15 are trapped in the portion made from the aromatic diamine molecule. The portion of the storage layer 15 made from the aromatic tetracarboxylic dianhydride molecule has an acceptor component. Therefore, it is considered that the electrons injected into the storage layer 15 are trapped in the portion made from the aromatic tetracarboxylic dianhydride molecule.

In a charge-transfer complex including a donor molecule and an acceptor molecule, both the donor molecule and the acceptor molecule have columnar structures. In the case where charge transfer occurs partially in the charge-transfer complex, the resistance decreases. Such a phenomenon is known for, for example, TTF-TCNQ complex, etc. On the other hand, the resistance does not decrease in a mixed stack complex.

In the case of the polyimide film PF, it is considered that the portion made from the aromatic diamine molecule which is a donor and the portion made from the aromatic tetracarboxylic dianhydride molecule which is an acceptor are not completely columnar and not completely a mixed stack complex but are partially columnar.

In the case where the thickness of the polyimide film PF is exceedingly thin (e.g., not more than 80 nm), it is considered that the polyimide film PF is in the partial charge transfer state recited above and is switched to the low resistance state (SET) when the amount of the electrons and the amount of the holes injected into the polyimide film PF exceed some threshold. In the SET operation, there are cases where it is necessary to cause a perturbation in the charge by applying a small voltage having a reverse bias. In the low resistance state, there are many cases where there is an ohmic current-voltage characteristic regardless of the direction of the applied voltage. There are many cases where the initial voltage application performs the SET after the charge fills irreversible trap sites of impurities and the like (forming). When the voltage of the reverse bias is applied, the charge that was injected is discharged at some threshold; and the polyimide film PF returns to the high resistance state (RESET).

Various substances are proposed as the memory substance of a resistance change nonvolatile memory device. Among them, an organic memory having an interposed organic substance is easy to pattern, has a small current value, and can have low power consumption when the density is high. However, many organic substances generally have poor thermal stability; and there are many cases where such organic substances are not matched to the manufacturing of other silicon devices that are necessary to drive the memory. Therefore, an organic memory has been proposed in which a polyimide thin film which has high thermal stability is used in a nonvolatile bipolar ReRAM having a structure in which the polyimide thin film is interposed between two types of electrodes. However, because the mechanism has not been clarified for the ReRAM using the polyimide thin film, it has not been possible to sufficiently design the voltage of the switching, the repetition tolerance, the retention time, etc.; and the memory characteristics have therefore been insufficient. The voltage of the switching is, for example, the voltage value necessary to cause the transition between the low resistance state and the high resistance state. The repetition tolerance is, for example, the number of times the transition between the low resistance state and the high resistance state can be performed. The retention time is, for example, the time that the low resistance state can be maintained.

The inventors of the application achieved the nonvolatile memory device 110 according to the embodiment by discovering the relationship between the electronic properties of aromatic polyimide source materials that have high thermal stability, the work functions of the electrodes, and the memory characteristics. In the nonvolatile memory device 110, the absolute value of the difference between the ionization potential of the aromatic diamine molecule and the first work function WF1 is set to be not less than 0.5 eV and not more than 2.0 eV; and the absolute value of the difference between the electron affinity of the aromatic tetracarboxylic dianhydride molecule and the second work function WF2 is set to be not less than 0.5 eV and not more than 2.0 eV. Thereby, in the nonvolatile memory device 110, good memory characteristics can be obtained in which the thermal stability is high, the voltage is low, the power consumption is low, and the repetition tolerance is good.

In the nonvolatile memory device 110, the absolute value of the difference between the absolute value of the difference between the ionization potential of the aromatic diamine molecule and the first work function WF1 and the absolute value of the difference between the electron affinity of the aromatic tetracarboxylic dianhydride molecule and the second work function WF2 is set to be not more than 0.5 eV. Thereby, the balance between the electron injection and the hole injection can be maintained; and the driving of the element (the transition between the low resistance state and the high resistance state) can be stabilized further.

In the nonvolatile memory device 110, the thickness of the storage layer 15 is set to be not less than 5 nm and not more than 80 nm. In the case where the thickness of the storage layer 15 is thinner than 5 nm, leaks undesirably occur easily. In the case where the thickness of the storage layer 15 is thicker than 80 nm, the drive voltage becomes undesirably high. It is favorable for the thickness of the storage layer 15 to be not less than 10 nm and not more than 30 nm. Thereby, the occurrence of the leaks and the increase of the drive voltage can be suppressed more appropriately.

The first conductive unit 10 and the second conductive unit 20 may include, for example, at least one selected from aluminum (Al, 4.2 eV), copper (Cu, 4.7 eV), titanium nitride (TiN, 4.7 eV), iridium (Ir, 5.3 eV), platinum (Pt, 5.7 eV), silver (Ag, 4.3 eV), gold (Au, 4.7 eV), polysilicon (Si, 4.8 eV), tungsten (W, 4.6 eV), titanium (Ti, 4.3 eV), tantalum (Ta, 4.3 eV), tantalum nitride (TaN, 5.4 eV), tungsten nitride (WN, 5.0 eV), molybdenum nitride ($Mo_2N$, 5.3 eV), nickel (Ni, 5.0 eV), nickel silicide (NiSi, 4.9 eV), titanium silicide ($TiSi_2$, 4.5 eV), cobalt (Co, 5.0 eV), chrome (Cr, 4.5 eV), antimony (Sb, 4.6 eV), iron (Fe, 4.5 eV), molybdenum (Mo, 4.4 eV), palladium (Pd, 4.9 eV), tin (Sn, 4.4 eV), zirconium (Zr, 4.1 eV), zinc (Zn, 4.3 eV), indium tin oxide (ITO, 4.7 eV), and carbon (C, 4.5 eV). The numerical values inside the parentheses of the materials of the first conductive unit 10 and the second conductive unit 20 recited above are the work functions.

The surfaces of the material of the first conductive unit 10 and the material of the second conductive unit 20 may be modified with an organic coupling agent that has a polarity. The magnitude of the work function value can be increased by the polarity. Polysilicon, carbon, etc., may be doped with an impurity. The work function can be changed by the material of the impurity that is doped and the amount of the impurity.

It is favorable for the carbon to include, for example, carbon nanotubes, graphene, etc. Polysilicon, carbon, etc., may be doped; and the work function is changed by the doping material and/or the amount of the doping material. It is favorable for the carbon to be carbon nanotubes, graphene, etc.

For example, AXIS-ultra made by Shimadzu Corporation is used to measure the work functions of the first conductive unit 10 and the second conductive unit 20. He I (21.21 eV) is used as the light source of the AXIS-ultra. The measurement conditions include: Wide scan-pass energy (called EP hereinbelow): 5.0, 10.0 eV (0.1 eV/step, 100 ms), Narrow scan-EP: 5.0, 10.0 eV (0.05 eV/step, 1000 ms). −10 V is applied to the stage to accurately detect photoelectrons having low kinetic energy. Au for which the surface is cleaned by Ar ion etching is used as the reference for the Fermi-edge position. The first conductive unit 10 and the second conductive unit 20 are cleaned by performing Ar ion etching. The work function is determined by 21.21—(cut-off voltage—Fermi-edge voltage).

Figure 3:
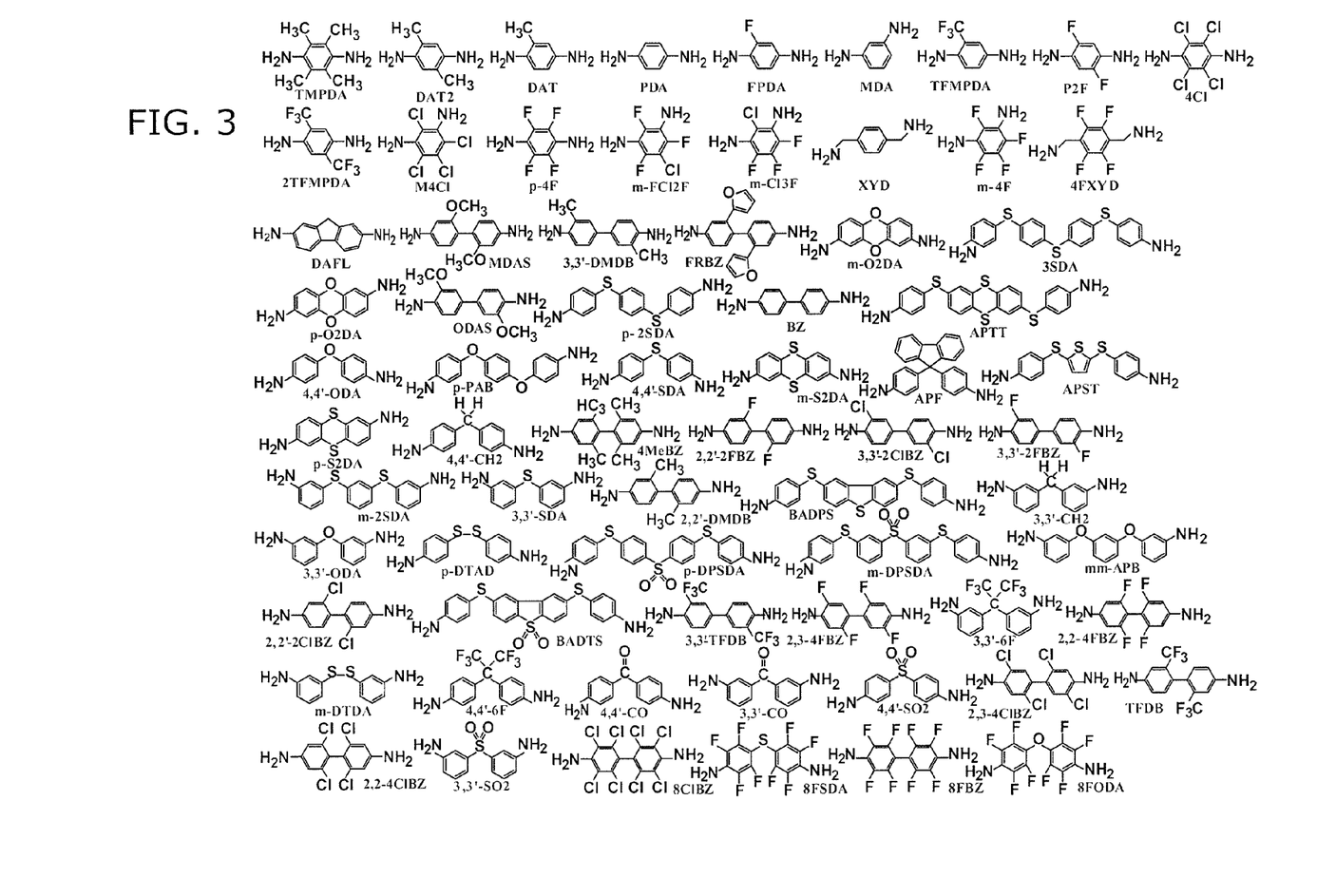
FIG. 3 shows chemical formulas of some materials of the nonvolatile memory device according to the first embodiment.

FIG. 3 shows chemical formulas of some materials of the nonvolatile memory device according to the first embodiment.

FIG. 3 shows the chemical formulas and abbreviations of aromatic diamine molecules used in the storage layer 15 (the polyimide film PF).

As shown in FIG. 3, the aromatic diamine molecule of the storage layer 15 may include, for example, at least one selected from DAFL (6.5 eV), MDAS (6.6 eV), TMPDA (6.6 eV), 3,3'-DMDB (6.6 eV), FRBZ (6.6 eV), m-O2DA (6.6 eV), 3SDA (6.6 eV), p-O2DA (6.7 eV), ODAS (6.7 eV), 2SDA (6.7 eV), BZ (6.7 eV), APTT (6.7 eV), 4,4'-ODA (6.8 eV), ppAPB (6.8 eV), 4,4'-SDA (6.8 eV), DAT (6.8 eV), m-S2DA (6.9 eV), APF (6.9 eV), APST (6.9 eV), DAT (6.9 eV), pS2DA (6.9 eV), 4,4'-CH2 (6.9 eV), 4MeBZ (7.0 eV), 2,2'-DFBZ (7.0 eV), 3,3'-DCIBZ (7.0 eV), PDA (7.0 eV), 3,3'-DFBZ (7.0 eV), m-2SDA (7.1 eV), 3'-SDA (7.1 eV), 2,2'-DMDB (7.1 eV), BADPS (7.1 eV), 3,3'-CH2 (7.1 eV), 3,3'-ODA (7.1 eV), pDTDA (7.1 eV), pDPSDA (7.2 eV), mDPSDA (7.2 eV), mmAPB (7.2 eV), 2,2'-DCIBZ (7.2 eV), BADTS (7.3 eV), FPDA (7.3 eV), PANS (7.3 eV), 3,3'-TFDB (7.3 eV), 2,3-4FBZ (7.4 eV), 3,3'-6F (7.4 eV), 4FBZ (7.4 eV), mDTDA (7.4 eV), MDA (7.4 eV), 4,4'-6F (7.4 eV), 4,4'-CO (7.4 eV), TFMPDA (7.4 eV), 3,3'-CO (7.4 eV), p-2F (7.5 eV), 4,4'-SO2 (7.5 eV), 2,3-4CIBZ (7.5 eV), TFDB (7.6 eV), p-4CI (7.6 eV), 4CIBZ (7.7 eV), MANS (7.7 eV), 3,3'-SO2 (7.7 eV), 8CIBZ (7.8 eV), 2TFMPDA (7.8 eV), m-4CI (7.8 eV), p-4F (7.9 eV), 8FSDA (7.9 eV), 8FBZ (8.0 eV), MFCI2F (8.0 eV), MCI3F (8.0 eV), 8FODA (8.0 eV), XYD (8.1 eV), m-4F (8.1 eV), and 4FXYD (8.9 eV).

The numerical values inside the parentheses of the aromatic diamine molecules recited above are the ionization potentials.

Figure 4:
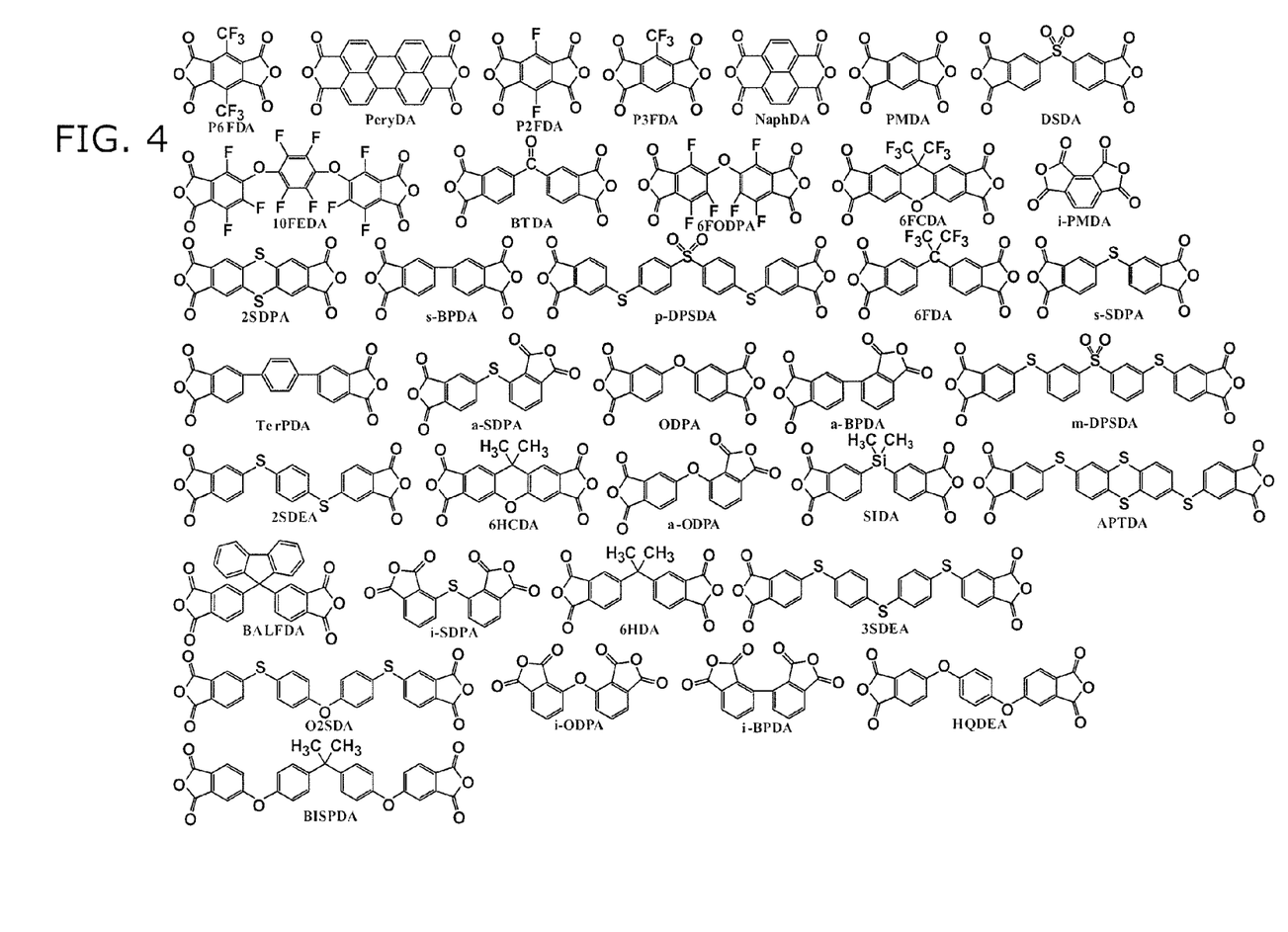
FIG. 4 shows chemical formulas of some materials of the nonvolatile memory device according to the first embodiment.

FIG. 4 shows chemical formulas of some materials of the nonvolatile memory device according to the first embodiment.

FIG. 4 shows the chemical formulas and abbreviations of aromatic tetracarboxylic dianhydride molecules used in the storage layer 15 (the polyimide film PF).

As shown in FIG. 4, the aromatic tetracarboxylic dianhydride molecule of the storage layer 15 may include, for example, at least one selected from P6FDA (4.7 eV), PeryDA (3.0 eV), P2FDA (3.0 eV), P3FDA (2.9 eV), NaphDA (2.9 eV), PMDA (2.6 eV), DSDA (2.6 eV), 10FEDA (2.6 eV), BTDA (2.6 eV), s-6FODPA (2.5 eV), 6FCDA (2.4 eV), i-PMDA (2.3 eV), 2SDPA (2.3 eV), s-BPDA (2.2 eV), pDPSDA (2.2 eV), 6FDA (2.2 eV), s-SDPA (2.2 eV), TerPDA (2.2 eV), a-SDPA (2.1 eV), s-ODPA (2.1 eV), a-BPDA (2.0 eV), mDPSDA (2.0 eV), 2SDEA (2.0 eV), 6HCDA (2.0 eV), a-ODPA (2.0 eV), SIDA (2.0 eV), APTDA (2.0 eV), BAFLDA (2.0 eV), i-SDPA (1.9 eV), 6HDA (1.9 eV), 3SDEA (1.9 eV), O2SDEA (1.9 eV), i-ODPA (1.9 eV), i-BPDA (1.9 eV), HQDEA (1.9 eV), and BISPDA (1.8 eV).

The numerical values inside the parentheses of the aromatic tetracarboxylic dianhydride molecules recited above are the electron affinities.

In the nonvolatile memory device 110, it is favorable to use an aromatic diamine molecule having the structural formula of at least one selected from Chemical Formula 1 and Chemical Formula 2 and an aromatic tetracarboxylic dianhydride molecule having the structural formula of at least one selected from Chemical Formula 3 and Chemical Formula 4. Thereby, it is possible to appropriately control the ionization potential and the electron affinity without using a substituent that reduces the thermal stability. In Chemical Formula 1, Chemical Formula 2, Chemical Formula 3, and Chemical Formula 4, X is one selected from O, $CH_2$, $C(CF_3)_2$, $CH-C_6H_5$, and S; and Y is at least one selected from H, F, and $CF_3$. The numeral appended to Y is the number of Y's. In the case where multiple Y's are included, Y may be the same or different.

When making the nonvolatile memory device 110, for example, one selected from the first conductive unit 10 and the second conductive unit 20 is made on a substrate; subsequently, the polyimide film PF is formed as the storage layer 15; and the other selected from the first conductive unit 10 and the second conductive unit 20 is made on the polyimide film PF. The order of making the first conductive unit 10 and the second conductive unit 20 is arbitrary; and either can be made first.

When making the storage layer 15, first, a solution of polyamic acid which is a precursor is made from a source material including at least the aromatic diamine molecule and the aromatic tetracarboxylic dianhydride molecule. The polyamic acid solution is coated onto the first conductive unit 10 or onto the second conductive unit 20; and the polyamic acid solution is imidized by dehydration at a high temperature. Thereby, the storage layer 15 is made on the first conductive unit 10 or on the second conductive unit 20.

When coating the polyamic acid solution, a coating method such as, for example, spin coating, dip coating, the Langmuir-Blodgett method, atomization coating, flow coating, screen printing, electrostatic coating, blade coating, roll coating, inkjet printing, or the like is used.

The solvent when making the polyamic acid solution may include, for example, at least one selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, and acetonitrile. One type of material may be used in the solvent; or a mixture of two or more types of materials in any proportion may be used.

Figure 5A:
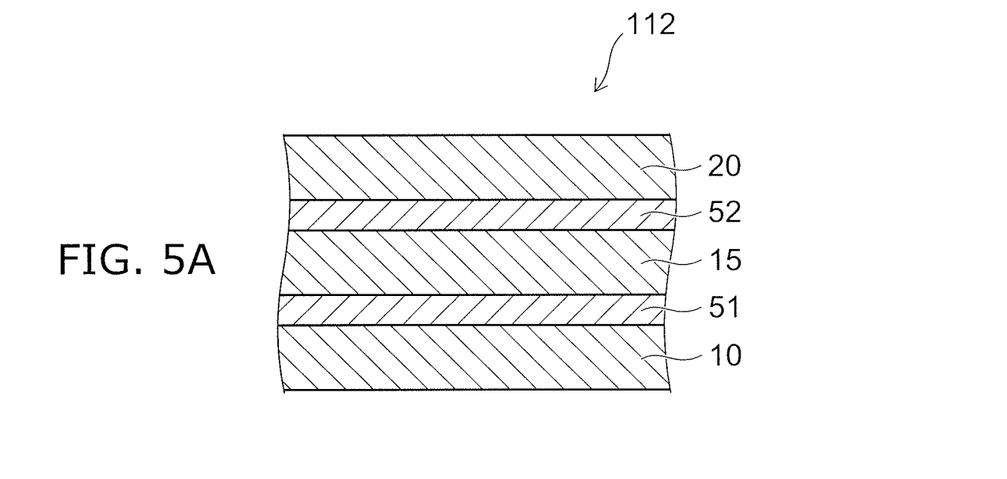
FIG. 5A and FIG. 5B are schematic cross-sectional views showing other nonvolatile memory devices according to the first embodiment.
Figure 5B:
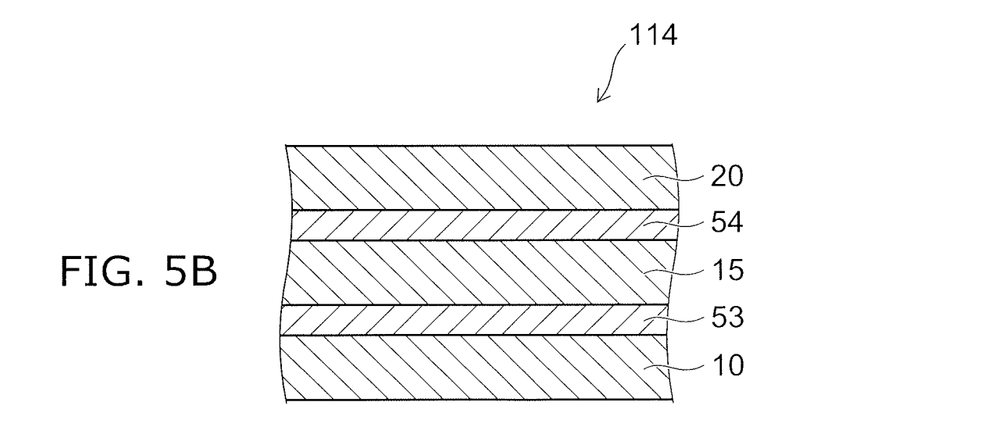

FIG. 5A and FIG. 5B are schematic cross-sectional views showing other nonvolatile memory devices according to the first embodiment.

As shown in FIG. 5A, a nonvolatile memory device 112 further includes a first organic coupling layer 51 and a second organic coupling layer 52.

The first organic coupling layer 51 is provided between the first conductive unit 10 and the storage layer 15. The second organic coupling layer 52 is provided between the second conductive unit 20 and the storage layer 15. For example, the first organic coupling layer 51 increases the affinity between the first conductive unit 10 and the storage layer 15 that includes the polyimide film PF. For example, the first organic coupling layer 51 suppresses peeling of the first conductive unit 10 from the storage layer 15 and instability of the transfer of the charge between the first conductive unit 10 and the storage layer 15. It is also possible to change the work function of the first conductive unit 10 by providing the first organic coupling layer 51. For example, the second organic coupling layer 52 increases the affinity between the storage layer 15 and the second conductive unit 20. The second organic coupling layer 52 suppresses peeling of the second conductive unit 20 from the storage layer 15 and instability of the transfer of the charge between the second conductive unit 20 and the storage layer 15. It is also possible to change the work function of the second conductive unit 20 by providing the second organic coupling layer 52. Only one selected from the first organic coupling layer 51 and the second organic coupling layer 52 may be provided in the nonvolatile memory device 112.

The material of the first organic coupling layer 51 is selected according to, for example, the material of the first conductive unit 10. For example, the first organic coupling layer 51 includes a thiol-type sulfur compound, etc., in the case where the first conductive unit 10 includes a noble metal such as gold, silver, etc. For example, the first organic coupling layer 51 includes a phosphonic acid compound, etc., in the case where the first conductive unit 10 includes a material that forms a surface oxide film such as nickel, chrome, iron, ITO, etc. For example, the first organic coupling layer 51 includes a silane coupling agent, etc., in the case where an oxide of silicon or the like that has a high acidity is provided at the surface of the first conductive unit 10. The material of the second organic coupling layer 52 is set according to the material of the second conductive unit 20. The material of the second organic coupling layer 52 is substantially the same as the material of the first organic coupling layer 51.

As shown in FIG. 5B, a nonvolatile memory device 114 further includes a first oxide film 53 and a second oxide film 54.

The first oxide film 53 is provided between the first conductive unit 10 and the storage layer 15. The second oxide film 54 is provided between the second conductive unit 20 and the storage layer 15. The first oxide film 53 and the second oxide film 54 include, for example, at least one selected from the group consisting of SiOx, AlOx, NiOx, NbOx, TiOx, CrOx, VOx, FeOx, TaOx, CuOx, MgOx, WOx, AlNOx, TiNOx, SiNOx, and TaNOx. It is favorable for the material of the first oxide film 53 and the material of the second oxide film 54 to be, for example, at least one selected from SiOx, $Al_2O_3$, $Cu_2O$, NiO, $TiO_2$, and $V_2O_3$.

The first oxide film 53 suppresses, for example, nonuniform oxidization of the surface of the first conductive unit 10, etching of the surface of the first conductive unit 10, etc., that occur due to the coating, baking, etc., of the polyamic acid solution when making the storage layer 15. The adhesion between the polyimide film PF and the first conductive unit 10 also can be increased. Thereby, the first oxide film 53 can suppress the peeling of the first conductive unit 10 from the storage layer 15 and the instability of the transfer of the charge between the first conductive unit 10 and the storage layer 15. The second oxide film 54 increases the adhesion between the polyimide film PF and the second conductive unit 20 by suppressing, for example, nonuniform oxidization of the surface of the second conductive unit 20, etching of the surface of the second conductive unit 20, etc. It is also possible for the second oxide film 54 to suppress the peeling of the second conductive unit 20 from the storage layer 15 and the instability of the transfer of the charge between the second conductive unit 20 and the storage layer 15.

The thickness of the first oxide film 53 and the thickness of the second oxide film 54 are set to be, for example, thicknesses that can inject sufficient charge into the storage layer 15. The thickness of the first oxide film 53 and the thickness of the second oxide film 54 change due to, for example, the conductivity of the materials that are used.

Only one selected from the first oxide film 53 and the second oxide film 54 may be provided in the nonvolatile memory device 114. It is sufficient for the first oxide film 53 and the second oxide film 54 to be provided, for example, on at least the one selected from the first conductive unit 10 and the second conductive unit 20 that is formed first on the substrate. In the nonvolatile memory device 114, for example, the first organic coupling layer 51 may be provided between the first oxide film 53 and the storage layer 15; and the second organic coupling layer 52 may be provided between the second oxide film 54 and the storage layer 15.

Examples of the nonvolatile memory device 110 according to the embodiment will now be described.

FIRST EXAMPLE

An aluminum film having a thickness of 80 nm is formed as the second conductive unit 20 on a silicon substrate on which a silicon oxide film is formed by vapor-depositing aluminum (having a work function of 4.2 eV) on the silicon substrate. A thin first oxide film 53 is formed on the second conductive unit 20 by processing the surface of the aluminum film by an UV-ozone cleaner.

A DMF solution of polyamic acid is made from a source material including at least an aromatic diamine molecule and an aromatic tetracarboxylic dianhydride molecule. The aromatic diamine molecule includes BZ (Ip=6.7 eV) having the structural formula of Chemical Formula 5. The aromatic tetracarboxylic dianhydride molecule includes PMDA (Ea=2.6 eV) having the structural formula of Chemical Formula 6.

[Chemical Formula 5]

[Chemical Formula 6]

The polyimide film PF having a thickness of 10 nm to 15 nm is formed as the storage layer 15 on the second conductive unit 20 by coating the DMF solution onto the silicon substrate by spin coating, baking at 100° C., and subsequently heating at 350° C. The nonvolatile memory device 110 of the first example is made by forming the first conductive unit 10 by vapor-depositing gold (having a work function of 4.7 eV) on the storage layer 15.

When a voltage of a forward bias is applied between the first conductive unit 10 and the second conductive unit 20, the state is switched to the low resistance state (SET) at about 4 V (forming). For the voltage of the forward bias, the second conductive unit 20 is set to have the reference potential (e.g., the ground potential); and the first conductive unit 10 is set to have a positive potential. In other words, the potential of the first conductive unit 10 is set to be higher than the potential of the second conductive unit 20. When a voltage of a reverse bias is applied between the first conductive unit 10 and the second conductive unit 20, the state is switched to the high resistance state at about −2 V. When the voltage of the forward bias is applied again between the first conductive unit 10 and the second conductive unit 20, the state is switched to the low resistance state at about 2.5 V; and thereafter, the SET-RESET is repeated. In the state in which a voltage is not applied after being switched to the high resistance state, the low resistance state does not change even after being left for about one week. In the state in which a voltage is not applied after being switched to the low resistance state, the high resistance state does not change even after being left for about one week. Thus, in the nonvolatile memory device 110 of the first example, stable memory characteristics are obtained.

SECOND EXAMPLE

A gold film having a thickness of 80 nm is formed as the second conductive unit 20 on a silicon substrate on which a silicon oxide film is formed by vapor-depositing gold (having a work function of 4.7 eV) on the silicon substrate. When making the DMF solution in the example, the aromatic diamine molecule includes BZ (Ip=6.7 eV) having the structural formula of Chemical Formula 5; and the aromatic tetracarboxylic dianhydride molecule includes P2FDA (Ea=3.0 eV) having the structural formula of Chemical Formula 7.

[Chemical Formula 7]

The polyimide film PF having a thickness of 15 nm to 20 nm is formed as the storage layer 15 on the second conductive unit 20 by coating the DMF solution onto the silicon substrate by spin coating, baking at 100° C., and subsequently heating at 350° C. The nonvolatile memory device 110 of the second example is made by forming the first conductive unit 10 by vapor-depositing gold (having a work function of 4.7 eV) on the storage layer 15.

When a voltage of a forward bias is applied between the first conductive unit 10 and the second conductive unit 20, the state is switched to the low resistance state (SET) at about 4 V (forming). When a voltage of a reverse bias is applied between the first conductive unit 10 and the second conductive unit 20, the state is switched to the high resistance state at about −2.5 V. When the voltage of the forward bias is applied again between the first conductive unit 10 and the second conductive unit 20, the state is switched to the low resistance state at about 3 V; and thereafter, the SET-RESET is repeated. In the state in which a voltage is not applied after being switched to the high resistance state, the low resistance state does not change even after being left for about one week. In the state in which a voltage is not applied after being switched to the low resistance state, the high resistance state does not change even after being left for about one week. Thus, in the nonvolatile memory device 110 of the second example, stable memory characteristics are obtained.

THIRD EXAMPLE

An ITO film having a thickness of 80 nm is formed as the first conductive unit 10 on a silicon substrate on which a silicon oxide film is formed by forming ITO (having a work function of 4.7 eV) on the silicon substrate by sputtering. The first organic coupling layer 51 is formed on the first conductive unit 10 by immersing the silicon substrate in a solution of the phosphonic acid coupling agent of Chemical Formula 8 to cause the phosphonic acid coupling agent to be subjected to monolayer adsorption to the surface of the first conductive unit 10. Thereby, the work function of the ITO film of the first conductive unit 10 increases to 5.2 eV. When making the DMF solution in the example, the aromatic diamine molecule includes 4,4′-ODA (Ip=6.8 eV) having the structural formula of Chemical Formula 9; and the aromatic tetracarboxylic dianhydride molecule includes P2FDA (Ea=3.0 eV) having the structural formula of Chemical Formula 7.

[Chemical Formula 8]

[Chemical Formula 9]

The polyimide film PF having a thickness of 15 nm to 20 nm is formed as the storage layer 15 on the first conductive unit 10 by coating the DMF solution onto the silicon substrate by spin coating, baking at 100° C., and subsequently heating at 350° C. The nonvolatile memory device 110 of the third example is made by forming the second conductive unit 20 by vapor-depositing gold (having a work function of 4.7 eV) on the storage layer 15.

When a voltage of a forward bias is applied between the first conductive unit 10 and the second conductive unit 20, the state is switched to the low resistance state (SET) at about 3.5 V (forming). When a voltage of a reverse bias is applied between the first conductive unit 10 and the second conductive unit 20, the state is switched to the high resistance state at about −2 V. When the voltage of the forward bias is applied again between the first conductive unit 10 and the second conductive unit 20, the state is switched to the low resistance state at about 2.5 V; and thereafter, the SET-RESET is repeated. In the state in which a voltage is not applied after being switched to the high resistance state, the low resistance state does not change even after being left for about one week. In the state in which a voltage is not applied after being switched to the low resistance state, the high resistance state does not change even after being left for about one week. Thus, in the nonvolatile memory device 110 of the third example, stable memory characteristics are obtained.

FIRST COMPARATIVE EXAMPLE

The nonvolatile memory device is made similarly to the first example except that the aromatic diamine molecule includes TPA (Ip=4.9 eV) having the structural formula of Chemical Formula 10 instead of BZ having the structural formula of Chemical Formula 5.

[Chemical Formula 10]

In the nonvolatile memory device of the first comparative example, the absolute value of the difference between the work function (4.7 eV) of the first conductive unit 10 of gold and the ionization potential Ip of the aromatic diamine molecule is 0.2 eV which is less than 0.5 eV. In the nonvolatile memory device of the first comparative example as well, the switching phenomenon (the transition between the low resistance state and the high resistance state) is observed. However, in the nonvolatile memory device of the first comparative example, the DRAM operation is observed and its record retention time is short. Thus, good memory characteristics are not obtained in the nonvolatile memory device of the first comparative example.

SECOND COMPARATIVE EXAMPLE

The nonvolatile memory device is made similarly to the first example except that the first conductive unit 10 includes aluminum instead of gold.

In the nonvolatile memory device of the second comparative example, the absolute value of the difference between the ionization potential Ip (6.7 eV) of the aromatic diamine molecule of BZ and the work function (4.2 eV) of the first conductive unit 10 of aluminum is 2.5 eV which is greater than 2.0 eV. In the nonvolatile memory device of the second comparative example as well, the state is switched to the low resistance state (SET) at about 8 V (the forming); the state is switched to RESET at −4 V; the state is switched to SET at 5 V; and the switching phenomenon is observed. However, in the nonvolatile memory device of the second comparative example, the switching is no longer observed after several repetitions. Thus, in the nonvolatile memory device of the second comparative example, good memory characteristics are not obtained.

Second Embodiment

The nonvolatile memory device according to the embodiment is a cross-point nonvolatile memory device.

Figure 6:
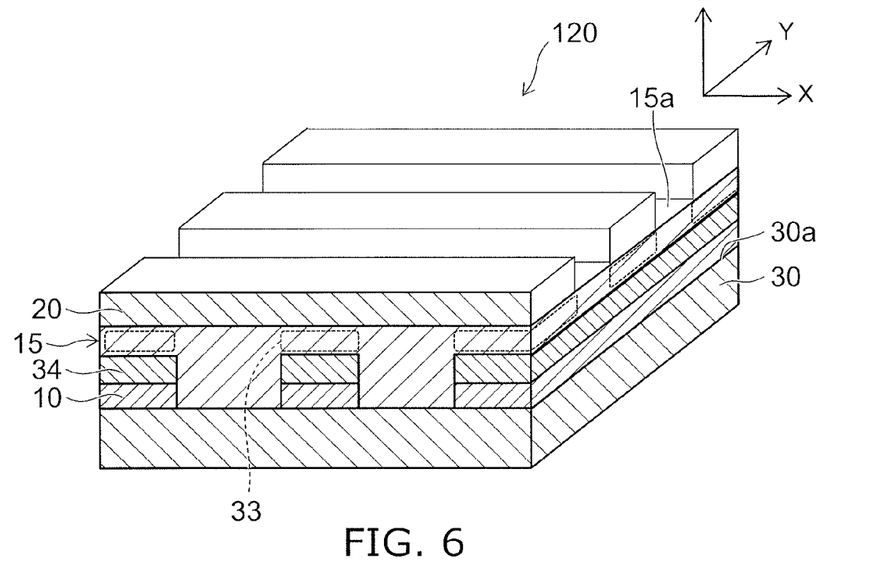
FIG. 6 is a schematic perspective view showing the nonvolatile memory device according to the second embodiment.

FIG. 6 is a schematic perspective view showing the nonvolatile memory device according to the second embodiment.

As shown in FIG. 6, the nonvolatile memory device 120 according to the embodiment includes a substrate 30. The substrate 30 may include, for example, a silicon substrate, a semiconductor substrate, a substrate including an inorganic substance, a substrate including a polymer, etc. The semiconductor substrate may include, for example, a silicon-on-insulator (SOI) substrate, etc. The substrate including the inorganic substance may include, for example, glass, etc.

Herein, a plane parallel to a major surface 30a of the substrate 30 is taken as an X-Y plane. One direction in the X-Y plane is taken as an X-axis direction. A direction perpendicular to the X-axis direction in the X-Y plane is taken as a Y-axis direction. A direction perpendicular to the X-axis direction and the Y-axis direction is taken as a Z-axis direction.

The multiple first conductive units 10 and the multiple second conductive units 20 are provided in the nonvolatile memory device 120. Each of the multiple first conductive units 10 extends in the Y-axis direction. The multiple first conductive units 10 are arranged with a prescribed spacing in the X-axis direction. Each of the multiple second conductive units 20 extends in the X-axis direction. The multiple second conductive units 20 are arranged with a prescribed spacing in the Y-axis direction. In the example, the extension direction of the first conductive unit 10 is orthogonal to the extension direction of the second conductive unit 20. It is sufficient for the extension direction of the first conductive unit 10 to cross (be non-parallel to) the extension direction of the second conductive unit 20.

In other words, each of the multiple second conductive units 20 extends in a first direction (the X-axis direction) parallel to the major surface 30a; and the multiple second conductive units 20 are arranged in a direction (the Y-axis direction) that is parallel to the major surface 30a and crosses the first direction. Each of the multiple first conductive units 10 is provided between the major surface 30a and the multiple second conductive units 20 to extend parallel to the major surface 30a in a second direction (the Y-axis direction) crossing the first direction; the multiple first conductive units 10 are arranged in a direction (the X-axis direction) that is parallel to the major surface 30a and crosses the second direction; and each of the multiple first conductive units 10 crosses each of the multiple second conductive units 20 when projected onto a plane (the X-Y plane) parallel to the major surface 30a.

The storage layer 15 is provided in each space between the multiple first conductive units 10 and the multiple second conductive units 20. In the example, the storage layer 15 also is provided between the substrate 30 and the multiple second conductive units 20. For example, the storage layer 15 is provided on the entirety of the substrate 30 and the multiple first conductive units 10. The storage layer 15 extends through each space between the multiple first conductive units 10 and the multiple second conductive units 20. The storage layer 15 has an upper surface 15a that is parallel to the major surface 30a of the substrate 30. The multiple second conductive units 20 are provided on the upper surface 15a. The thickness (the length along the Z-axis direction) of the storage layer 15 between the second conductive units 20 and the first conductive units 10 is thinner than the thickness of the storage layer 15 between the substrate 30 and the second conductive units 20.

The portion of the storage layer 15 between the first conductive unit 10 and the second conductive unit 20 acts as one memory cell 33. The portion of the storage layer 15 between the substrate 30 and the second conductive unit 20 acts as, for example, an inter-layer insulating film. The thickness of the memory cell 33 is, for example, not less than 5 nm and not more than 80 nm. The dielectric constant of the polyimide film PF included in the storage layer 15 is smaller than the dielectric constant of silicon oxide which is mainly used as inter-layer insulating films. Therefore, in the nonvolatile memory device 120, the parasitic capacitance that occurs between two mutually-adjacent first conductive units 10 can be reduced.

In the example, the multiple first conductive units 10 are, for example, word lines; and the multiple second conductive units 20 are, for example, bit lines. The first conductive units 10 may be the bit lines; and the second conductive units 20 may be the word lines. The multiple word lines and the multiple bit lines may be provided separately. In such a case, for example, it is sufficient to provide the first conductive units 10 and the second conductive units 20 only at the portions (the portions corresponding to the memory cells 33) where the word lines and the bit lines cross. The storage layer 15 may be provided only at the portions between the first conductive units 10 and the second conductive units 20. In other words, the multiple storage layers 15 may be provided respectively in each space between the multiple first conductive units 10 and the multiple second conductive units 20.

The nonvolatile memory device 120 further includes a rectifying element 34. The rectifying element 34 is, for example, a diode. The rectifying element 34 is multiply provided. The multiple rectifying elements 34 are provided respectively in each space between the storage layer 15 and the multiple first conductive units 10. The rectifying element 34 may be formed by, for example, causing conductors having different work functions to contact each other. The first conductive unit 10 also may function as the rectifying element 34. The rectifying element 34 is configured such that the forward direction is the orientation of the current flowing between the first conductive unit 10 and the storage layer 15. Thereby, the rectifying elements 34 suppress sneak current when programming/reading. In other words, by suppressing the current flowing in the reverse direction, the rectifying elements 34 suppress problems such as the data of adjacent memory cells 33 being modified, etc. The rectifying elements 34 may be provided between the storage layer 15 and the second conductive units 20.

In the nonvolatile memory device 120, 4F2 cells can be realized because one memory cell 33 is provided by the first conductive units 10 and the second conductive units 20 crossing each other.

In the nonvolatile memory device 120, sufficient switching characteristics can be obtained without degradation of the characteristics of the memory cell 33 even in the case where normal semiconductor processes such as vapor deposition processes, photolithography processes, dry etching, etc., are performed.

Figure 7:
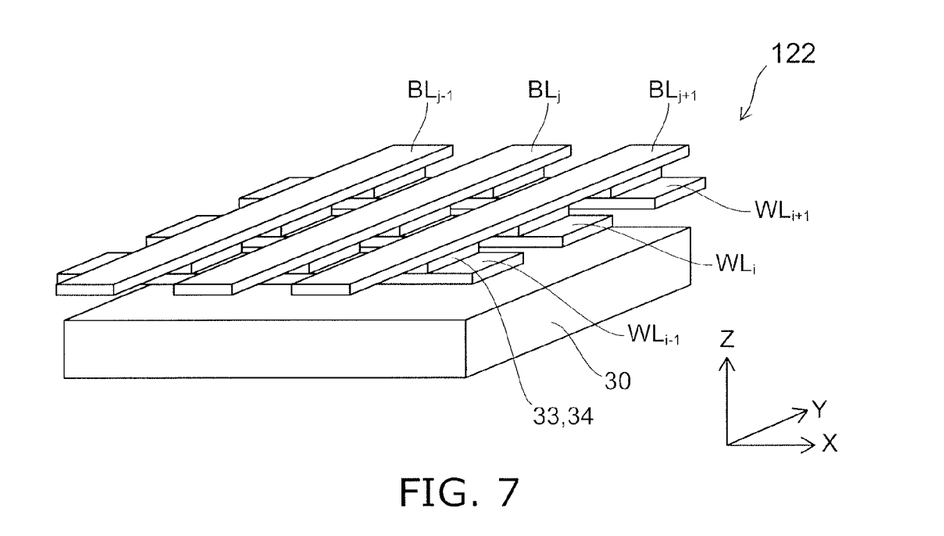
FIG. 7 is a schematic perspective view showing another nonvolatile memory device according to the second embodiment.

FIG. 7 is a schematic perspective view showing another nonvolatile memory device according to the second embodiment.

Figure 8:
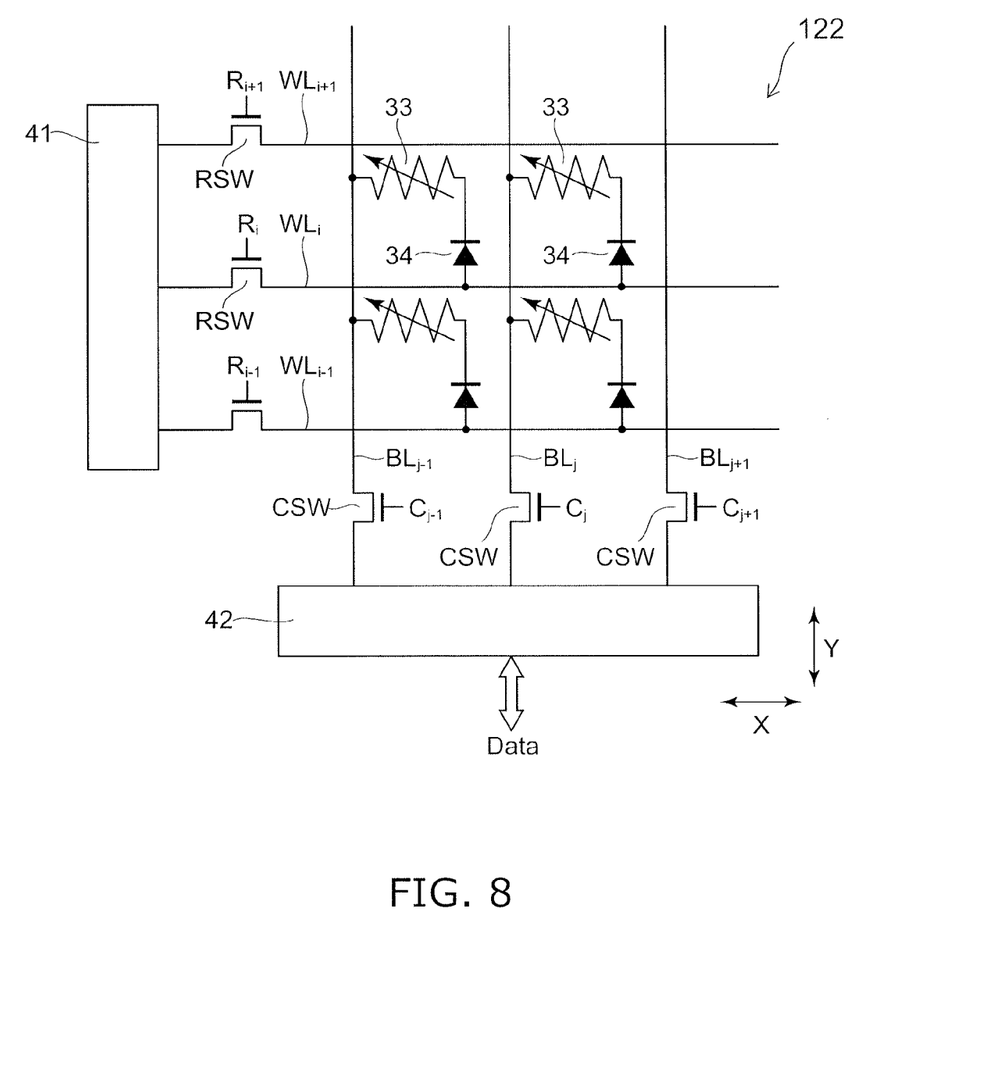
FIG. 8 is a schematic view showing the nonvolatile memory device according to the second embodiment.

FIG. 8 is a schematic view showing the nonvolatile memory device according to the second embodiment.

In the nonvolatile memory device 122 according to the embodiment as shown in FIG. 7, first interconnects (word lines and $WL_{i-1}$, $WL_i$, $WL_{i+1}$) are provided in line configurations on the major surface of the substrate 30 to extend in the X-axis direction. Second interconnects (bit lines $BL_{j-1}$, $BL_j$, and $BL_{j+1}$) are provided in line configurations that extend in the Y-axis direction. The second interconnects (the bit lines $BL_{j-1}$, $BL_j$, and $BL_{j+1}$) oppose the first interconnects (the word lines $WL_{i-1}$, $WL_i$, and $WL_{i+1}$).

Although the extension direction of the first interconnects is orthogonal to the extension direction of the second interconnects in the description recited above, it is sufficient for the extension direction of the first interconnects to cross (be non-parallel to) the extension direction of the second interconnects.

The index i and the index j recited above are arbitrary. In other words, the number of the first interconnects and the number of the second interconnects are arbitrary.

In this specific example, the first interconnects are the word lines; and the second interconnects are the bit lines. However, the first interconnects may be the bit lines; and the second interconnects may be the word lines. In the description hereinbelow, the first interconnects are the word lines; and the second interconnects are the bit lines.

As shown in FIG. 7 and FIG. 8, the memory cells 33 are provided between the first interconnects and the second interconnects.

As shown in FIG. 7, for example, one end of each of the word lines $WL_{i-1}$, and $WL_i$, and $WL_{i+1}$ is connected to a word line driver 41, which has a decoder function, via MOS transistors RSW which are selection switches. One end of each of the bit lines $BL_{j-1}$, $BL_j$, and $BL_{j+1}$ is connected to a bit line driver 42, which has a decoder function and a read-out function, via MOS transistors CSW which are selection switches.

Selection signals $R_{i-1}$, $R_i$, and $R_{i+1}$ for selecting the word lines (the rows) are input to the gates of the MOS transistors RSW; and selection signals $C_{i-1}$, $C_i$, and $C_{i+1}$ for selecting the bit lines (the columns) are input to the gates of the MOS transistors CSW.

The memory cells 33 are disposed at the intersections where the word lines $WL_{i-1}$, $WL_i$, and $WL_{i+1}$ and the bit lines $BL_{j-1}$, $BL_j$, and $BL_{j+1}$ oppose each other. The rectifying elements 34 may be added to the memory cells 33 to suppress the sneak current when programming/reading.

Figure 9:
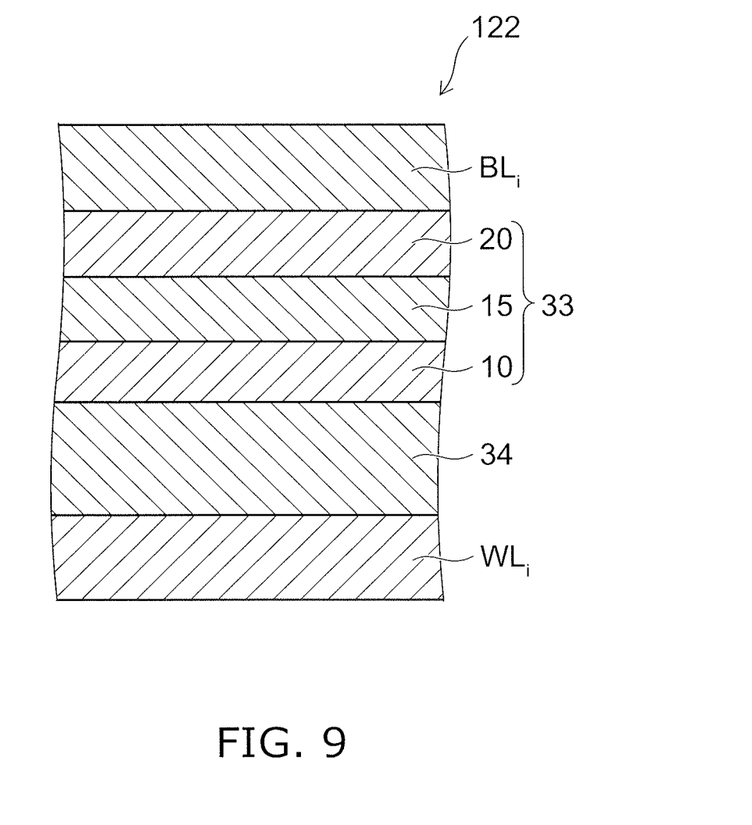
FIG. 9 is a schematic cross-sectional view showing a portion of the nonvolatile memory device according to the second embodiment.

FIG. 9 is a schematic cross-sectional view showing a portion of the nonvolatile memory device according to the second embodiment.

As shown in FIG. 9, the memory cell 33 and the rectifying element 34 are provided between the word line $WL_i$ and the bit line $BL_j$. The vertical disposition of the word line $WL_i$ and the bit line $BL_j$ is arbitrary. The order of the disposition of the memory cell 33 and the rectifying element 34 between the word line $WL_i$ and the bit line $BL_j$ is arbitrary.

As shown in FIG. 9, the memory cell 33 includes the first conductive unit 10, the second conductive unit 20, and the storage layer 15 provided between the first conductive unit 10 and the second conductive unit 20. The first conductive unit 10, the second conductive unit 20, and the storage layer 15 may be those described in regard to the first embodiment. In the example, the first conductive unit 10 is provided between the word line $WL_i$ (the first interconnect) and the bit line $BL_j$ (the second interconnect); the storage layer 15 is provided between the first conductive unit 10 and the bit line $BL_j$; and the second conductive unit 20 is provided between the storage layer 15 and the bit line $BL_j$.

For example, at least one selected from the word line $WL_i$, the rectifying element 34, and the bit line $BL_j$ that is adjacent to the memory cell 33 may be used as at least one selected from the first conductive unit 10 and the second conductive unit 20.

In the nonvolatile memory device 122 as well, good memory characteristics can be obtained by using the storage layer 15 in which the absolute value of the difference between the ionization potential of the aromatic diamine molecule and the first work function WF1 is set to be not less than 0.5 eV and not more than 2.0 eV, and the absolute value of the difference between the electron affinity of the aromatic tetracarboxylic dianhydride molecule and the second work function WF2 is set to be not less than 0.5 eV and not more than 2.0 eV.

According to the embodiments, a nonvolatile memory device having good characteristics is provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the nonvolatile memory device such as the first conductive unit, the second conductive unit, the storage layer, the organic coupling layer, the oxide film, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all nonvolatile memory devices practicable by an appropriate design modification by one skilled in the art based on the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a first conductive unit having a first work function;
a second conductive unit having a second work function smaller than the first work function; and
a storage layer provided between the first conductive unit and the second conductive unit, the storage layer being reversibly transitionable between a first state and a second state by at least one selected from a voltage applied via the first conductive unit and the second conductive unit and a current supplied via the first conductive unit and the second conductive unit, the second state having a higher resistance than the first state,
the storage layer being made using a source material including an aromatic diamine molecule and an aromatic tetracarboxylic dianhydride molecule,
an ionization potential of the aromatic diamine molecule being greater than the first work function,
an absolute value of the difference between the ionization potential and the first work function being not less than 0.5 eV and not more than 2.0 eV,
an electron affinity of the aromatic tetracarboxylic dianhydride molecule being less than the second work function,
an absolute value of the difference between the electron affinity and the second work function being not less than 0.5 eV and not more than 2.0 eV.

2. The device according to claim 1, wherein
the aromatic diamine molecule is at least one selected from Chemical Formula 1 and Chemical Formula 2, and
the aromatic tetracarboxylic dianhydride molecule is at least one selected from Chemical Formula 3 and Chemical Formula 4,

[Chemical Formula 1]

[Chemical Formula 2]

[Chemical Formula 3]

[Chemical Formula 4]

where, in each of Chemical Formula 1, Chemical Formula 2, Chemical Formula 3, and Chemical Formula 4, X is one selected from O, $CH_2$, $C(CF_3)_2$, $CH—C_6H_5$, and S, Y is at least one selected from H, F, and $CF_3$, and Y may be the same or different.

3. The device according to claim 1, wherein a absolute value of the difference between the absolute value of the difference between the ionization potential and the first work function and the absolute value of the difference between the electron affinity and the second work function is not more than 0.5 eV.

4. The device according to claim 1, further comprising an organic coupling layer provided between the first conductive unit and the storage layer.

5. The device according to claim 4, wherein the organic coupling layer includes one selected from a thiol-type sulfur compound, a phosphonic acid compound, and a silane coupling agent.

6. The device according to claim 4, wherein
the aromatic tetracarboxylic dianhydride molecule includes P2FDA having the structural formula of Chemical Formula 7,
the organic coupling layer includes a phosphonic acid coupling agent of Chemical Formula 8, and
the aromatic diamine molecule includes 4,4'-ODA having the structural formula of Chemical Formula 9

[Chemical Formula 7]

[Chemical Formula 8]

[Chemical Formula 9]

7. The device according to claim 1, further comprising an organic coupling layer provided between the second conductive unit and the storage layer.

8. The device according to claim 1, further comprising:
a first organic coupling layer provided between the first conductive unit and the storage layer; and
a second organic coupling layer provided between the second conductive unit and the storage layer.

9. The device according to claim 1, further comprising an oxide film provided between the first conductive unit and the storage layer.

10. The device according to claim 9, wherein the oxide film includes at least one selected from the group consisting of SiOx, AlOx, NiOx, NbOx, TiOx, CrOx, VOx, FeOx, TaOx, CuOx, MgOx, WOx, AlNOx, TiNOx, SiNOx, and TaNOx.

11. The device according to claim 1, further comprising an oxide film provided between the second conductive unit and the storage layer.

12. The device according to claim 1, further comprising:
a first oxide film provided between the first conductive unit and the storage layer; and
a second oxide film provided between the second conductive unit and the storage layer.

13. The device according to claim 12, further comprising:
a first organic coupling layer provided between the first oxide film and the storage layer; and
a second organic coupling layer provided between the second oxide film and the storage layer.

14. The device according to claim 1, wherein a thickness of the storage layer is not less than 5 nm and not more than 80 nm.

15. The device according to claim 1, wherein
the aromatic diamine molecule includes BZ having the structural formula of Chemical Formula 5, and
the aromatic tetracarboxylic dianhydride molecule includes PMDA having the structural formula of Chemical Formula 6

[Chemical Formula 5]

[Chemical Formula 6]

16. The device according to claim 1, wherein
the aromatic diamine molecule includes BZ having the structural formula of Chemical Formula 5, and
the aromatic tetracarboxylic dianhydride molecule includes P2FDA having the structural formula of Chemical Formula 7

[Chemical Formula 5]

-continued

[Chemical Formula 7]

17. The device according to claim 1, further comprising a substrate having a major surface,
a plurality of the first conductive units and a plurality of the second conductive units being provided,
each of the second conductive units extending in a first direction parallel to the major surface, the second conductive units being arranged in a direction parallel to the major surface and crossing the first direction,
each of the first conductive units being provided between the major surface and the second conductive units to extend parallel to the major surface in a second direction crossing the first direction, the first conductive units being arranged in a direction parallel to the major surface and crossing the second direction, each of the first conductive units crossing each of the second conductive units when projected onto a plane parallel to the major surface, and
the storage layer extending through each space between the first conductive units and the second conductive units.

18. The device according to claim 17, further comprising a plurality of rectifying elements provided respectively in each space between the storage layer and the first conductive units, an orientation of a current flowing between the storage layer and the first conductive units being the forward direction of the rectifying elements.

19. The device according to claim 1, further comprising:
a substrate having a major surface;
a first interconnect extending in a direction parallel to the major surface;
a second interconnect extending in a direction crossing the first interconnect; and
a memory cell provided between the first interconnect and the second interconnect,
the memory cell including the first conductive unit, the second conductive unit, and the storage layer.

20. The device according to claim 19, wherein
the first conductive unit is disposed at the intersection where the first interconnect and the second interconnect oppose each other,
the storage layer is provided between the first conductive unit and the second interconnect, and
the second conductive unit is provided between the storage layer and the second interconnect.

* * * * *